United States Patent [19]

Sierawski et al.

[11] Patent Number: 5,882,467
[45] Date of Patent: Mar. 16, 1999

[54] ORGANOSILOXANE COMPOSITIONS YIELDING CURED PRODUCTS EXHIBITING ADHESION AND REDUCED FLAMMABILITY

[75] Inventors: David Alan Sierawski; Steven West Wilson, both of Midland; Beth Ann Witucki, Bay City, all of Mich.

[73] Assignee: Dow Corning Corporation, Midland, Mich.

[21] Appl. No.: 959,661

[22] Filed: Oct. 28, 1997

Related U.S. Application Data

[63] Continuation of Ser. No. 588,794, Nov. 9, 1996, abandoned, which is a continuation of Ser. No. 298,092, Aug. 30, 1994, abandoned.

[51] Int. Cl.⁶ .............................. B32B 31/00; C09J 1/00
[52] U.S. Cl. ...................... 156/329; 106/18.26; 524/114; 524/175
[58] Field of Search ............................. 156/329; 524/114, 524/175; 106/18.26

[56] References Cited

U.S. PATENT DOCUMENTS

| | | | |
|---|---|---|---|
| 3,167,602 | 1/1965 | Bentov et al. | 264/4 |
| 5,204,384 | 4/1993 | Matsushita et al. | 524/175 |
| 5,215,581 | 6/1993 | Stewart et al. | 106/18.26 |
| 5,364,921 | 11/1994 | Gray et al. | 156/329 |

FOREIGN PATENT DOCUMENTS

| | | | |
|---|---|---|---|
| 497349 | 8/1992 | European Pat. Off. | 524/114 |

*Primary Examiner*—John J. Gallagher
*Attorney, Agent, or Firm*—Sharon K. Severance

[57] ABSTRACT

The combination of reduced flammability and adhesion can be imparted to cured organosiloxane materials when the curable compositions used to prepare these materials contain 1) an adhesion promoting composition comprising up to about 0.1 weight percent, based on the weight of the curable composition, of a chelated organoaluminum compound in combination with an organic epoxide compound and an alkoxysilane or condensation product of the silane, and 2) as a flame-retarding additive, hydrated aluminum oxide and/or magnesium hydroxide, preferably in combination with additional fillers such as quartz.

15 Claims, No Drawings

ORGANOSILOXANE COMPOSITIONS YIELDING CURED PRODUCTS EXHIBITING ADHESION AND REDUCED FLAMMABILITY

This application is a continuation of application Ser. No. 08/588,794 filed Jan. 19, 1996 which application is now abandoned: which is a continuation of application Ser. No. 08/298,092 filed Aug. 30, 1994 which application is now abandoned.

BACKGROUND OF THE INVENTION

1. Field of the Invention

This invention relates to organosiloxane compositions that cure by a platinum-catalyzed hydrosilation reaction. More particularly this invention relates to organosiloxane compositions exhibiting a desirable combination of reduced flammability and adhesion to both organic polymers and aluminum substrates following curing.

2. Background Information

The curing characteristics of organosiloxane compositions that cure by a platinum-catalyzed hydrosilation reaction and the properties of the cured materials obtained from these compositions are desirable for a variety of end use applications, particularly in the electrical and electronics areas. The cured materials are useful as protective coatings, potting materials and encapsulants for integrated circuits and other electronic devices and as coatings for printed circuit boards.

A shortcoming of organosiloxane compositions that cure by a hydrosilation reaction is their inability to adhere strongly to many substrates, particularly plastics and certain metals. One method for remedying this deficiency is by the use of primer compositions or adhesion promoting additives containing silanes and organosiloxanes with a plurality of silicon-bonded hydrolyzable groups and at least one organofunctional substituent that is bonded to silicon through at least one carbon atom. Primer compositions are applied to substrates to which adhesion is desired prior to application of the curable organosiloxane composition. Adhesion promoters are present in the curable organosiloxane composition.

Examples of hydrolyzable groups that are present in known adhesion-promoting organosilicon compounds are alkoxy, carboxy such as acetoxy, ketoximo such as methylethyl ketoximo, and amido. The organofunctional group is typically one that will react with the substrate to which adhesion is desired. Examples of suitable organofunction groups include but are not limited to alkenyl such as vinyl and allyl, aminoalkyl, epoxyalkyl, mercaptoalkyl and (meth) acryloxyalkyl.

U.S. Pat. No. 4,808,640 describes organic or silicone resin compositions containing up to 100 weight percent, based on the weight of the resin, of particles obtained by curing an organosiloxane composition containing an alkoxy substituted silane such as 3-glycidoxypropyl-trimethoxysilane and an aluminum or zirconium compound.

U.S. Pat. No. 5,166,293 describes organosiloxane compositions containing a polyorganosiloxane with at least two vinyl groups per molecule, organohydrogensiloxanes, a platinum-containing hydrosilation catalyst, and organosiloxanes containing alkoxy and epoxy groups.

The use of organic or organosilicon compounds containing epoxy groups in combination with an organic aluminum compound as an adhesion promoter for organosiloxane compositions that cure by a platinum catalyzed hydrosilation reaction is taught in Japanese patent no. 88-48902.

The present inventors discovered that addition of even small amounts of organoaluminum compounds such as aluminum acetylacetonate substantially increases the flammability of the composition.

The use of hydrated aluminum oxide or magnesium oxide in combination with platinum to reduce the flammability of elastomers prepared from peroxide-curable organosiloxane compositions is described in U.S. Pat. No. 4,288,360.

A disadvantage of inorganic flame retarding agents such as hydrated aluminum oxide and magnesium hydroxide is their adverse effect at moderate to high filler loadings on the adhesion of organosiloxane compositions that cure by a platinum catalyzed hydrosilation reaction.

The present inventors have found that when used at concentrations above about 10 percent, based on the total weight of the curable composition, these flame retarding agents may at least partially offset the improvement in adhesion obtained by the addition of an organic epoxide compound, a chelated organoaluminum compound and an alkoxy silane or condensation product of the silane. The present inventors also discovered that the organic aluminum compounds that have been used to promote the reaction of epoxide groups substantially increase the flammability of cured elastomeric products prepared from curable organosiloxane compositions containing these compounds as an component of the adhesion-promoting additive.

One objective of this invention is to provide a combination of additives for organosiloxane compositions that provide both reduced flammability and adhesion without adversely affecting the ability of the compositions to cure by a platinum group metal catalyzed hydrosilation reaction.

SUMMARY OF THE INVENTION

The present inventors discovered that a desirable combination of reduced flammability and adhesion can be imparted to cured organosiloxane materials when the curable compositions used to prepare these materials contain an adhesion promoting composition comprising up to about 0.1 weight percent, based on the weight of the curable composition, of an organoaluminum compound in combination with an organic epoxide compound or an epoxy functional organosilicon compound, and an alkoxysilane or condensation product of the silane, and up to about 10 weight percent of hydrated aluminum oxide and/or magnesium hydroxide as a flame retarding additive. The flame-retarding additive preferably constitutes no more that about 10 weight percent of the total filler present in the composition.

The concentrations of flame retarding agent, total filler and adhesion promoting ingredients must be within specified limits to achieve the desired levels of adhesion and flame retardancy.

DETAILED DESCRIPTION OF THE INVENTION

This invention provides a curable organosiloxane composition comprising (A) a polyorganosiloxane containing at least two alkenyl radicals per molecule, (B) an amount sufficient to cure said composition of an organohydrogensiloxane containing at least two silicon-bonded hydrogen atoms per molecule, where the sum of the alkenyl radicals per molecule of (A) and the silicon-bonded hydrogen atoms per molecule of (B) is greater than 4, (C) an amount sufficient to promote curing of said composition of a hydrosilation catalyst selected from the group consisting of metals from the platinum group of the periodic table and compounds of said metals, and (D) an amount sufficient to impart adhesion to cured articles prepared from said composition of 1) an epoxide compound; 2) an organosilicon compound selected from the group consisting of silanes exhibiting the general formula $R^1_a SiX_{3-a}$, and hydrolysis/condensation products of said silanes, where $R^1$ represents a monovalent hydrocarbon radical, X represents a hydrolyzable group and a is 0 or 1; 3) a chelated aluminum compound derived from a 1,3-diketone; and (E) an amount sufficient to impart flame retardancy to said composition of an additive comprising at least one compound selected from the group consisting of hydrated aluminum oxide and magnesium hydroxide.

To maximize flame retardancy in the cured materials, the curable composition additionally contains a reinforcing or non-reinforcing filler that constitutes at least 90 percent of the combined weight of this filler and the flame retarding agent.

The Adhesion Promoting Additive (Ingredient D)

One of the characterizing features of the present curable organosiloxane compositions is the adhesion promoting additive, which allows excellent adhesion to be achieved to a variety of substrates at curing temperatures below 150° C., preferably from 100° to about 110° C. using curing times of 15 minutes or less.

The present adhesion additives consist essentially of the combination of an epoxide compound (ingredient D1), a silane containing at least three hydrolyzable groups or a hydrolysis/condensation product of this type of silane (ingredient D2), and up to 1 weight percent of a chelated aluminum salt of a 1,3-diketone such as acetonylacetone.

One ingredient of the present adhesion promoters is an epoxide compound, referred to hereinafter as ingredient D1. Any of the known liquid organic epoxide compounds or epoxy-functional organosilicon compounds are suitable for use in the present compositions. When the epoxide compound is an organic epoxide compound, the hydrocarbon portion of the epoxide compound can be aliphatic, cycloaliphatic or aromatic. The epoxide compound can contain other substituents such as halogen atoms that will not interfere with curing and/or adhesion of the present organosiloxane compositions. A thorough discussion of epoxide compounds and the relative reactivity of the various types of epoxide compounds is contained in a text entitled "The Handbook of Epoxy Resins" by Lee and Neville.

Epoxide compounds suitable for use in the present invention are liquids at 25° C. and boil above the curing temperature of the present compositions, which is typically below about 150° C., preferably from 100° to 105° C. The organic epoxide compounds contain one or more epoxide groups as substituents on a hydrocarbon radical that may contain additional substituents such as ether groups and ethylenically unsaturated groups. The hydrocarbon radicals can be aliphatic, cycloaliphatic or aromatic. Preferred epoxide compounds contain cycloaliphatic or aralkyl radicals. Suitable epoxides include but are not limited to glycidyl ethers or phenols, bis-phenols, and mono- and polyhydric alcohols; compounds containing at least one cyclic hydrocarbon radical with epoxyalkyl groups as substituents, such as styrene oxide, limolene oxide, cyclohexene oxide, bis(2,3-epoxypropoxy)cyclohexane and 3,4-epoxycyclohexylmethyl-3,4-epoxycyclohexylcarboxylate.

Epoxy-functional organosilicon compounds can be silanes or organosiloxanes containing at least one epoxide group per molecule that is typically bonded to silicon through an alkylene radical. Preferred compounds of this type are silanes of the general formula

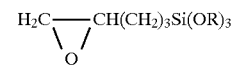

and organosiloxanes containing at least one repeating unit of the formula —(R')(Q)SiO— wherein R' represents a monovalent hydrocarbon radical and Q represents the group

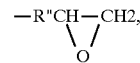

wherein R" is an alkylene radical. Siloxanes of this type can be prepared by reacting an organosiloxane containing at least one silicon-bonded hydrogen atom with an ethylenically unsaturated epoxide compound such as allyl glycidyl ether.

Preferred epoxide compounds are the cycloaliphatic polyepoxide monomers or prepolymers containing at least one 5- or 6-membered ring substituted with an epoxide-functional group. In the polycyclic cycloaliphatic epoxides, the two rings are preferably independent, being joined by a bridging radical containing at least one ester or ether linkage.

The concentration of epoxy-substituted organic or organosilicon compound is from about 0.1 to about 5 weight percent, preferably from 0.5 to 2 weight percent, based on the weight of the curable organosiloxane composition.

The second reactive ingredient of the present adhesion promoting additive, referred to as ingredient D2, is a silane containing at least three alkoxy or other hydrolyzable groups per molecule or a hydrolysis/condensation product of this type of silane. Suitable hydrolyzable groups do not interfere with curing of the present compositions, and typically include alkoxy, enoloxy and ketoximo groups. Ingredient D2 can be represented by the general formula $R^1_a SiX_{4-a}$. Condensation products of tetraalkoxysilanes are referred to as alkyl polysilicates, which typically exhibit a three-dimensional crosslinked structure.

In this formula $R^1$ represents an unsubstituted or substituted monovalent hydrocarbon radical, X is a hydrolyzable group, preferably an alkoxy group containing from 1 to about 4 carbon atoms, an enoloxy group containing from 3 to about 6 carbon atoms or a ketoximo group containing from 2 to about 6 carbon atoms, and a is 0 or 1. The hydrolysis/condensation products useful in the present compositions are typically liquids exhibiting a viscosity of up to about 10,000 centipoise (10 Pa.s).

$R^1$ is preferably an alkyl radical, and most preferably contains from 1 to 4 carbon atoms.

Examples of silanes suitable for use as ingredient D2 include but are not limited to methyltrimethoxysilane, methyl triethoxysilane, methyl tris(methylethylketoximo) silane, methyl tetraethoxysilane, typically referred to as tetraethyl orthosilicate, and tetra-n-propyl orthosilicate. Suitable condensation products are methyl polysilicate and ethyl polysilicate. The silanes and condensation products that constitute ingredient D2 can be used individually or in mixtures containing two or more of these compounds.

Silanes containing alkenyl radicals such as vinyl are not desirable because of their tendency to inhibit curing.

Preferred compositions contain alkyl polysilicates such as ethyl polysilicate as ingredient D2. This preference is based on the lower flammability and more consistent adhesion of cured articles prepared using these less volatile organosilicon compounds relative to articles prepared from compositions containing the corresponding and relatively more volatile tetraalkyl orthosilicate.

The concentration of ingredient D2 in the present compositions is typically from about 0.1 to about 5 weight percent, preferably from 0.25 to 2 weight percent, based on the weight of the curable composition.

The chelated organoaluminum compounds used in the present adhesion promoting additives are derivatives of 1,3 diketones such as acetonylacetone. A preferred aluminum compound is aluminum acetonylacetonate.

The chelated organoaluminum compound typically constitutes from 0.02 to 0.5 weight percent, preferably from 0.05 weight percent to about 0.1 percent, of the total weight of the present curable organosiloxane composition.

In the absence of the present flame retarding agents, concentrations greater than about 0.05 weight percent of the organoaluminum compound substantially increase the flammability of elastomers and other articles prepared from the present compositions. When the concentration of the organoaluminum compound exceeds about 1 weight percent the concentration of the flame retarding agent required to adequately suppress flammability adversely affects the adhesion exhibited by the cured organosiloxane composition.

The Flame Retarding Additive (Ingredient E)

The flame retarding additive, referred to hereinafter as ingredient E, reduces the flammability of the cured articles such as coatings and shaped articles prepared using the present compositions without reducing the ability of these articles to adhere to metals such as aluminum and copper and engineering plastics such as polycarbonates and polysulfones. The flame retarding additive constitutes from 1 to about 10 weight percent, preferably from 2 to about 6 weight percent, of the present compositions, and includes at least one member selected from the group consisting of hydrated aluminum oxide and magnesium hydroxide.

The adhesion developed between the present compositions and difficult-to-adhere-to substrates such as engineering plastics developed during curing of the present compositions is substantially reduced when the concentration of flame retarding agent is greater than about 10 weight percent.

To maximize the effectiveness of the flame retarding agent, this ingredient is preferably used in combination with at least one of the reinforcing or non-reinforcing fillers typically used in organosiloxane compositions.

Preferred reinforcing fillers include the fume and precipitated types of silica. Non-reinforcing fillers include but are not limited to quartz, calcium carbonate and titanium dioxide.

The present inventors discovered that the burning time following exposure to a flame of a cured article prepared using one of the present compositions is minimized when these additional fillers constitute at least 90 percent of the combined weight of these fillers and the present flame-retarding agents. To achieve the optimum combination of flame retardancy and adhesion in preferred curable compositions, these additional fillers preferably constitute from about 35 to about 50 weight percent of the curable composition.

The Alkenyl-Containing Polyorganosiloxane (Ingredient A)

The curable polyorganosiloxane, referred to as ingredient A of the curable organosiloxane compositions of this invention, is the principal organosilicon ingredient of these compositions. This ingredient must contain at least two silicon-bonded alkenyl radicals in each molecule. Suitable alkenyl radicals contain from 1 to about 10 carbon atoms and are exemplified by but not limited to vinyl, allyl and 5-hexenyl. The silicon-bonded organic groups other than alkenyl radicals present in ingredient A are typically monovalent hydrocarbon and halogenated hydrocarbon radicals exemplified by but not limited to alkyl radicals such as methyl, ethyl and propyl; aryl radicals such as phenyl; and halogenated alkyl radicals such as 3,3,3-trifluoropropyl.

The molecular structure of ingredient A is typically linear, however there can be some branding due to the presence of trivalent siloxane units within the molecule. To achieve a useful level of tensile properties in the elastomers prepared by curing the present compositions, the molecular weight of this ingredient should be sufficient to achieve a viscosity at 25° C. greater than about 0.1 Pa.s. The upper limit for the molecular weight of ingredient A is not specifically restricted, and is typically limited only by the processability of the curable organosiloxane composition. The polyorganosiloxanes range from pourable liquids to gum type polymers that are typically characterized by Williams plasticity values.

Preferred embodiments of ingredient A are polydiorganosiloxanes represented by the general formula I

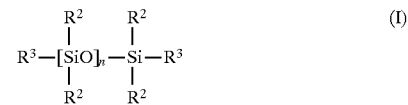

where each $R^2$ is individually selected from monovalent hydrocarbon radicals and monovalent halohydrocarbon radicals, $R^3$ represents a vinyl or other alkenyl radical, and n represents a degree of polymerization equivalent to a viscosity of at least 100 centipoise (0.1 Pa.s), preferably from 0.1 to 10 Pa.s.

The two $R^2$ substituents on each of the silicon atoms in formula I can be identical or different, and can contain from 1 to about 20 carbon atoms. A range of from 1 to 10 carbon atoms is preferred based on the availability of the corresponding monomers. Most preferably at least one of the hydrocarbon radicals on each silicon atom is methyl, and any remainder are vinyl, phenyl and/or 3,3,3-trifluoropropyl, this preference being based on the availability of the reactants typically used to prepare the polydiorganosiloxane and the properties of cured elastomers prepared from these polydiorganosiloxanes. For the same reasons, $R^3$ is preferably vinyl or 5-hexenyl.

Representative embodiments of ingredient A containing ethylenically unsaturated hydrocarbon radicals only at the terminal positions include but are not limited to dimethylvinylsiloxy-terminated polydimethylsiloxanes, dimethylvinylsiloxy-terminated polymethyl-3,3,3-trifluoropropylsiloxanes, dimethylvinylsiloxy-terminated-dimethylsiloxane/3,3,3-trifluoropropylmethylsiloxane copolymers and dimethylvinylsiloxy-terminated-dimethylsiloxane/methylphenylsiloxane copolymers.

Methods for preparing ingredient A of the present compositions by hydrolysis and condensation of the corresponding halosilanes or by condensation of the cyclic polydiorganosiloxanes are sufficiently disclosed in the patent and other literature that a detailed description in this specification is not necessary.

For applications requiring high levels of physical properties such as tear strength it may be desirable to include in the curable organosiloxane composition a second polydiorganosiloxane containing ethylenically unsaturated hydrocarbon radicals bonded to both terminal and non-terminal silicon atoms.

The Organohydrogensiloxane (Ingredient B)

The curable organosiloxane compositions of this invention contain at least one organohydrogensiloxane that functions as a crosslinking agent for ingredient A. In the presence of the hydrosilation catalyst, referred to as ingredient C, the silicon-bonded hydrogen atoms in ingredient B undergo an addition reaction, referred to as hydrosilation, with the silicon-bonded alkenyl groups in ingredient A, resulting in crosslinking and curing of the composition.

Ingredient B must contain at least 2 silicon-bonded hydrogen atoms in each molecule. If ingredient A contains only two alkenyl radicals per molecule, ingredient B must contain an average of more than two silicon-bonded hydrogen atoms to achieve a crosslinked structure in the final cured product. The silicon-bonded organic groups present in ingredient B are selected from the same group of monovalent hydrocarbon and halogenated hydrocarbon radicals as the organic groups of ingredient A, with the proviso that the organic groups in ingredient B must be substantially free of ethylenic or acetylenic unsaturation. The molecular structure of ingredient B can be straight chain, branch-containing straight chain, cyclic, or network.

While the molecular weight of ingredient B is not specifically restricted, viscosities in the range of 3 to 10,000 centipoise (0.003 to 10 Pa.s) at 25 degrees Centigrade are preferred.

The concentration of ingredient B is sufficient to provide a molar ratio of silicon-bonded hydrogen atoms to alkenyl radicals in the curable composition of from 0.5 to 20. A range of from 0.5 to 2 is preferred.

When the curable composition contains less than 0.5 moles of silicon-bonded hydrogen atoms per mole of alkenyl radicals the composition cannot be satisfactorily cured. Bubble formation resulting from the generation of hydrogen gas can occur when the composition contains more than about 20 silicon-bonded hydrogen atoms per alkenyl radical.

The Platinum-Containing Hydrosilation Reaction Catalyst (Ingredient C)

Curing of the present compositions is catalyzed by a hydrosilation catalyst that is a metal from the platinum group of the periodic table or a compound of such a metal. These metals include platinum, palladium and rhodium. Platinum and platinum compounds are preferred based on the high activity level of these catalysts in hydrosilation reactions.

Examples of preferred curing catalysts include but are not limited to platinum black, platinum metal on various solid supports, chloroplatinic acid, alcohol solutions of chloroplatinic acid, and complexes of chloroplatinic acid with liquid ethylenically unsaturated compounds such as olefins and organosiloxanes containing ethylenically unsaturated hydrocarbon radicals bonded to silicon. Complexes of chloroplatinic acid with the aforementioned organosiloxanes containing ethylenically unsaturated hydrocarbon radicals are described in U.S. Pat. No. 3,419,593, which issued to David N. Willing on Dec. 31, 1968. The relevant portions of this patent are incorporated herein by reference as a teaching of preferred catalysts.

The concentration of ingredient C in the present compositions is equivalent to a platinum concentration of from 0.1 to 500 parts by weight of platinum metal, preferably from 1 to 50 parts by weight of platinum metal, per million parts (ppm), based on the combined weight of ingredients A and B.

Curing does not proceed satisfactorily at below 0.1 ppm of platinum, while using more than 500 ppm results in no appreciable increase in cure rate, and is therefore uneconomical.

Optional Ingredients

Platinum Catalyst Inhibitor

Mixtures of the aforementioned ingredients A, B and C may begin to cure at ambient temperature. To obtain a longer working time or "pot life", the activity of the catalyst under ambient conditions can be retarded or suppressed by addition of a suitable inhibitor.

Known platinum catalyst inhibitors include the acetylenic compounds disclosed in U.S. Pat. No. 3,445,420, which issued on May 20, 1969 to Kookootsedes et al. Acetylenic alcohols such as 2-methyl-3-butyn-2-ol constitute a preferred class of inhibitors that will suppress the activity of a platinum-containing catalyst at 25° C. Compositions containing these catalysts typically require heating at temperatures of 70° C. or above to cure at a practical rate.

If it desired to increase the pot life of a curable composition under ambient conditions, this can be accomplished using an alkenyl substituted siloxane of the type described in U.S. Pat. No. 3,989,667, which issued on Nov. 2, 1976 to Lee and Marko. Cyclic methylvinylsiloxanes are preferred.

Inhibitor concentrations as low as one mole of inhibitor per mole of platinum will in some instances impart satisfactory storage stability and cure rate. In other instances inhibitor concentrations of up to 500 or more moles of inhibitor per mole of platinum are required. The optimum concentration for a given inhibitor in a given composition can readily be determined by routine experimentation and does not constitute part of this invention.

Some compositions may begin to cure under ambient conditions even when an inhibitor is present. One way to ensure storage stability is to package the ingredients of the curable composition in two or more containers, with the hydrosilation catalyst and the organohydrogensiloxane in separate containers. The contents of the containers are combined when it is desired to cure the composition.

One-part organosiloxane compositions having excellent long-term storage stability at temperature of up to 50° C. or higher can be prepared by first microencapsulating the platinum-containing hydrosilation catalyst in a thermoplastic or thermosetting polymer. Curable organosiloxane compositions containing microencapsulated hydrosilation catalysts are described in U.S. Pat. No. 4,766,176, which issued on Aug. 23, 1988 and U.S. Pat. No. 5,017,654, which issued on May 21, 1991. The teaching of these patents relating to storage stable one-part organosiloxane compositions is incorporated herein by reference. Suitable encapsulants include but are not limited to organosilicon resins and organic resins derived from ethylenically unsaturated hydrocarbons and/or esters of ethylenically unsaturated carboxylic acids such as acrylic and methacrylic acids.

Reinforcing and Non-Reinforcing Fillers

The desirability of using fillers in combination with the present flame retarding agents to decrease the flammability of cured articles prepared using the present compositions is discussed in a preceding section of this specification.

Silica and other reinforcing fillers are often treated with one of more of the known filler treating agents to prevent a phenomenon referred to as "creping" or "crepe hardening" during processing of the curable composition.

Finely divided forms of silica are preferred reinforcing fillers. Colloidal silicas are particularly preferred because of their relatively high surface area, which is typically at least 50 square meters per gram. Fillers having surface areas or at least 300 square meters per gram are preferred for use as reinforcing fillers in the present method. Colloidal silicas can be of the precipitated or a fume type. Both types of silica are commercially available.

When silica is used as a reinforcing filler, the filler treating agent can be any of the low molecular weight organosilicon compounds disclosed in the art as being suitable for preventing creping of organosiloxane compositions during processing. The treating agents are typically liquid hydroxyl terminated polydiorganosiloxanes containing an average of from 2 to about 20 repeating units per molecule, and organosilicon compounds such as hexaorganodisiloxanes and hexaorganodisilazanes that hydrolyze under the conditions used to treat the filler to form compounds with silicon-bonded hydroxyl groups. Preferably at least a portion of the silicon bonded hydrocarbon radicals present on the treating agent are identical to a majority of the hydrocarbon radicals present in ingredients A and B. A small amount of water can be added together with the silica treating agent(s) as a processing aid.

It is believed that the treating agents function by reacting with silicon-bonded hydroxyl groups present on the surface of the silica or other filler particles to reduce interaction between these particles.

When a silica filler is used, it is preferably treated in the presence of at least a portion of the other ingredients of the present compositions by blending these ingredients together until the filler is completely treated and uniformly dispersed to form a homogeneous material.

The ingredients that are present during treatment of the filler typically include the silica treating agents and at least a portion of the polydiorganosiloxane(s) referred to herein as ingredient A.

Additional Optional Ingredients

The present organosiloxane compositions can contain one or more additives that are conventionally present in curable compositions of this type to impart or enhance certain physical properties of the cured composition in addition to adhesion or to facilitate processing of the curable composition.

Typical additives include but are not limited to dyes, and heat and/or ultraviolet light stabilizers. Resinous organosiloxane copolymers can be used in place of or in combination with one or more reinforcing fillers to improve the physical properties of the cured organosiloxane composition.

A preferred type of resinous copolymer contains repeating units of the general formula $SiO_{4/2}$ in addition to triorganosiloxy units of the general formulae $R^4{}_3SiO_{1/2}$ and diorganovinylsiloxy units of the general formula $CH_2=CH(R^5)_2SiO_{1/2}$. In these formulae $R^4$ and $R^5$ are individually monovalent hydrocarbon or substituted monovalent hydrocarbon radicals as previously defined for the $R^2$ radicals of ingredient A.

The molar ratio of the combination of triorganosiloxy units and diorganovinylsiloxy units to $SiO_{4/2}$ units in the resinous copolymer is from 0.7 to 1.2, inclusive. The vinyl-containing units constitute from 2 to 8 percent by weight of the copolymer, which preferably contains at least two vinyl radicals per molecule. In preferred embodiments of the copolymer the ranges for the molar ratio of diorganovinylsiloxy:triorganosiloxy:$SiO_{4/2}$ units is 0.08–0.1:0.06–1:1.

The resinous copolymers can be prepared as described in U.S. Pat. No. 2,676,182, which issued to Daudt and Tyler on Apr. 20, 1954 and is hereby incorporated in this specification by reference thereto. The copolymers described in this patent contain from 2 to 23 percent by weight of hydroxyl groups, which is considerably above the maximum level of about 0.8 weight percent preferred for precursors of the present copolymers. The hydroxyl content of the precursor can be conveniently reduced to the desired level by employing a higher concentration of triorganosiloxane units than the concentration range taught by Daudt et al.

Briefly, the method of Daudt et al. comprises reacting a silica hydrosol under acidic conditions with the appropriate amount of hexamethyldisiloxane or trimethylchlorosilane. The resinous copolymers used to prepare the present elastomers can be obtained by reacting Daudt et al's. product with the required amount of a hexaorganodisilazane or a hexaorganodisiloxane wherein each silicon atom contains a vinyl radical and two methyl or other hydrocarbon radicals represented by $R^2$ and $R^3$ in the foregoing formula for the curable polyorganosiloxane.

The Preparation of Curable Compositions

The compositions of this invention can be prepared by combining all of ingredients at ambient temperature. Any of the mixing techniques and devices described in the prior art can be used for this purpose. The particular device used will be determined by the viscosity of the ingredients and the final curable composition. Suitable mixers include but are not limited to paddle type mixers, kneader type mixers and two- and three-roll rubber mills.

Cooling of the ingredients during mixing may be desirable to avoid premature curing of the composition.

To maximize storage stability the curable compositions are preferably kept in closed containers until used. If greater storage stability is desired, the compositions can be packaged in two or more containers with the organohydrogensiloxane (ingredient B) and the platinum group metal catalyst in separate containers.

Depending upon the types and concentrations of ingredients A and B, cured organosiloxane materials prepared using the present compositions can vary in properties from brittle resins to elastomers to gels, and are useful in a variety of end-use applications as coatings or as molded or extruded articles. Compositions containing less than about 20 weight percent of fillers are particularly useful as adhesives, protective coatings, encapsulants and potting compositions for protecting delicate electronic devices such as transistors and integrated circuits from damage by moisture and other materials present in the environment that can adversely affect operation of the device. The compositions can be used to coat either the individual devices or a circuit board containing a number of these devices together with other electronic components.

The present compositions can be applied to substrates by spraying, dipping, extrusion or by the use of a brush, roller or coating bar. The selection of a particular application method will be determined at least in part by the viscosity of the curable composition. The viscosity of the composition can be reduced using suitable solvents or reactive diluents as known in the art.

Curing of the present compositions commences when ingredients A, B and C are combined. One advantage of the present adhesion promoting compositions is the absence of substantial retardation of the curing reaction. A second advantage of these compositions is their ability to cohesively bond to a variety of organic and inorganic substrates at curing temperatures as low as 100° C. The compositions are therefore suitable for application to substrates that cannot withstand the elevated temperatures of 150° C. or higher required to cure organosiloxane compositions containing prior art adhesion promoters such as epoxide compounds that inhibit platinum group metal catalysts.

Preferred compositions cure over a period of several hours under ambient conditions. As is true for other compositions that cure by a platinum-catalyzed hydrosilation reaction, curing can be accelerated by heating. Curing temperatures of from 100° to about 110° C. are preferred.

EXAMPLES

The following examples demonstrate the criticality with respect to types and amounts of adhesion promoting additives and optional flame retarding agent(s) required to achieve a combination of adhesion to plastics and aluminum following curing at temperatures below 150° C. with an acceptable level of flame retardancy. The examples describe preferred composition, and should not be interpreted as limiting the scope of the present invention as defined in the accompanying claims. Unless otherwise indicated, all parts and percentages in the examples are by weight and viscosities were measured at 25° C.

EXAMPLE 1

This example demonstrates the effect of various known adhesion promoting additives on the adhesion to aluminum and a polysulfone of a preferred curable organosiloxane composition.

Two-part curable compositions were prepared by blending the following ingredients to homogeneity:
Part A:
624 parts of a dimethylvinylsiloxy-terminated polydimethylsiloxane having a viscosity of about 0.4 Pa.s at 25° C.;
4.7 parts of a reaction product of hexachloroplatinic acid and sym-tetramethyldivinyldisiloxane that had been diluted with a liquid dimethylvinylsiloxy terminated polydimethylsiloxane in an amount sufficient to achieve a platinum content of 0.7 weight percent.
460 parts of quartz exhibiting an average particle size of 5 microns; and
70 parts of a dispersion containing 13 weight percent of zinc oxide, 7 weight percent of carbon black and 80 weight percent of a dimethylvinylsiloxy-terminated polydimethylsiloxane having a viscosity of about 0.4 Pa.s at 25° C.

The type and amount of adhesion promoting ingredient(s) listed in Table 1 were blended with 100 parts of part A.
Part B:
900 parts of a dimethylvinylsiloxy-terminated polydimethylsiloxane having a viscosity of about 0.4 Pa.s at 25° C.
470 parts of quartz exhibiting an average particle size of 5 microns;
130 parts of a trimethylsiloxy-terminated polydiorganosiloxane having an average of five methylhydrogen-siloxane units and three dimethylsiloxane units per molecule with a silicon-bonded hydrogen atom content in the range from about 0.7 to 0.8 weight percent;
4.6 parts of cyclic methylvinylsiloxanes as a catalyst inhibitor; and
The type and amount of adhesion promoting ingredient(s) listed in Table 1 were blended with 100 parts of part B.

Curable organosiloxane compositions were prepared by blending to homogeneity equal weights of parts A and B containing the adhesion promoting additives to be evaluated. After being desired the resultant compositions were then poured into rectangular anodized aluminum containers measuring 4.5 by 9 cm. by 1 cm. in height and into rectangular polysulfone containers measuring 2.5 by 5 cm. by 1 cm in height. The compositions were cured by placing the filled container for 15 minutes on an electrically heated surface maintained at a temperature of 105° C. The adhesion and completeness of cure of each composition was subjectively rated by prying the cured composition away from the bottom and sides of the substrates an estimating the percentage of the uncovered surface area to which cured material remained adhered. The results of this evaluation are reported in Table 2.

The adhesion promoting ingredients evaluated are identified in Table 1 as follows:
A—3-Glycidoxypropyltrimethoxysilane
B—Ethyl polysilicate
C—Tetrabutyl titanate
D—Aluminum acetonylacetonate (as a 50 weight percent dispersion in a dimethylvinylsiloxy-terminated polydimethylsiloxane having a viscosity of about 0.4 Pa.s at 25° C.) Table 1 reports the amount of aluminum compound present in the composition.
E—A silanol-terminated dimethylsiloxane/methylvinylsiloxane copolymer containing 11 weight percent of vinyl radicals, 12 percent of silanol groups and exhibiting a viscosity of about 40 Pa.s
F—3,4-epoxycyclohexylmethyl-3,4-epoxycyclohexylcarboxylate
G—Tetraethyl orthosilicate
H—Vinyltrimethoxysilane
I—The diallyl ether of 2,2,2-trimethylolpropane

TABLE 1

| | Adhesion Promoter (Parts*) | |
| --- | --- | --- |
| Sample | Part A | Part B |
| 1 | 0.1 pt. D | 2 pts. A |
| | | 2 pts. B |
| 2 | 2.0 parts B | 2.0 parts A |
| | 2.0 parts C | |
| | 0.1 part D | |
| 3 | 1 part E | 0.1 part D |
| | 2.5 parts A | |
| 4 | 1 part F | 0.1 part D |
| | 1 part A | |
| | 1 part G | |
| 5 (Invention) | 2 parts F | 0.1 part D |
| | 1 part G | |

Samples 1–4 in Table 1 are comparative examples showing the adhesion achieved using organic and organosilicon compounds outside the scope of the present invention as adhesion promoting additives.

TABLE 2

| | Adhesion | | Cure | |
| --- | --- | --- | --- | --- |
| Sample | Al | Polysulfone | Al | Polysulfone |
| 1 | Spotty on bottom, good on sides | Adhered well to bottoms and sides | Good | Good |
| 2 | Bubbles on bottom | Bubbles on bottom | Inc. | Inc. |
| 3 | Good | Good | Slow | Slow |
| 4 | None on Bottom (air pocket) | Adheres to bottom and sides | Good | Good |
| 5 | Excellent | Excellent | Good | Good |

Inc. = Incomplete cure

Only the composition of the present invention (5) cured well with acceptable adhesion to both anodized aluminum and polysulfone.

EXAMPLE 2

This example demonstrates the effect of the concentration of each of the three adhesion-promoting ingredients on the adhesion exhibited by cured materials prepared using a composition of the present invention.

To determine the effective concentrations of the three adhesion promoting ingredients, three curable compositions were prepared by blending to homogeneity the following relative amounts of ingredients:

46.3 parts of a dimethylvinylsiloxy-terminated polydimethylsiloxane having a viscosity of about 0.4 Pa.s at 25° C.

43.7 parts of quartz with an average particle size of 5 microns 0.1 part of a reaction product of hexachloroplatinic acid and sym-tetramethyldivinyldisiloxane that has been diluted with a liquid dimethylvinylsiloxy terminated polydimethylsiloxane in an amount sufficient to achieve a platinum content of 0.7 weight percent;

3.15 parts of a dispersion containing 13 weight percent of zinc oxide, 7 weight percent carbon black and 80 weight percent of a dimethylvinylsiloxy-terminated polydimethylsiloxane having a viscosity of about 0.4 Pa.s at 25° C.;

0.5 part of ethyl polysilicate;

3.2 parts of a trimethylsiloxy-terminated polydiorganosiloxane having an average of five methylhydrogensiloxane units and three dimethylsiloxane units per molecule with a silicon-bonded hydrogen atom content in the range from about 0.7 to 0.8 weight percent:

0.06 part of cyclic methylvinylsiloxanes 3.12 magnesium hydroxide;

One of the compositions (I) also contained 0.5 part of ethyl polysilicate, 0.05 part of aluminum acetonylacetonate and the concentration of 3,4-epoxycyclohexylmethyl-3,4-epoxycyclohexylcarboxylate, also referred to as the epoxide compound, listed in Table 3.

A second composition (II) also contained 1.0 part of the epoxide compound, 0.05 part of aluminum acetonylacetonate and the amounts of ethyl polysilicate listed in Table 3. The third composition (III) also contained 1.0 part of the epoxide compound, 0.5 part of ethyl polysilicate and the amounts of aluminum acetonylacetonate listed in Table 3.

The adhesion of the resultant compositions to the anodized aluminum and polysulfone substrates described in Example 1 was evaluated using the method described in this example. Excellent adhesion implies cohesive failure (cured material remained adhered to substrate) over substantially the entire bottom and sides of the substrate. Some of the samples exhibited cohesive failure only in small, randomly located areas. This is referred to as "spotty" adhesion.

TABLE 3

| | Adhesion | |
|---|---|---|
| | Polysulfone | Anodized Aluminum |
| Composition I Epoxide Compound (Parts) | | |
| 0 | None | None |
| 0.25 | None | None |
| 0.5 | Spotty | None |
| 1.0 | Excellent | Excellent |
| 2.0 | Excellent | Excellent |
| 4.0 | Spotty | None |
| Composition II Ethyl Polysilicate (Parts) | | |
| 0 | None | None |
| 0.125 | Spotty | None |
| 0.25 | Excellent | Spotty |
| 0.5 | Excellent | Excellent |
| 1.0 | Spotty | Excellent |
| 2.0 | Spotty | Excellent |

TABLE 3-continued

| | Adhesion | |
|---|---|---|
| | Polysulfone | Anodized Aluminum |
| Composition III Aluminum Acetonylacetonate (Parts) | | |
| 0 | None | None |
| 0.01 | None | None |
| 0.025 | Spotty | Spotty |
| 0.05 | Excellent | Excellent |
| 0.1 | Excellent | Excellent |
| 0.2 | Spotty | Excellent |

[11095 pp 81–92]

EXAMPLE 3

The effect of the various adhesion-promoting ingredients of the present compositions on the flammability of the compositions when used in combination with a flame-retarding additive of the present invention was determined by blending 45 parts of the base portion with 50 parts of the curing agent portion of a curable composition and the amounts of adhesion promoting and flame-retarding additives listed in Table 4. A composition that did not contain any of the additives was used as a control and was prepared by blending equal parts of the base and curing agent portions.

The base portion of the curable compositions contained the following ingredients:

46 parts of a dimethylvinylsiloxy-terminated polydimethylsiloxane having a viscosity of about 0.4 Pa.s at 25° C.;

46 parts of finely divided quartz exhibiting an average particle size of 5 micrometers;

7 parts of a dispersion containing 13 percent of zinc oxide. 7 percent carbon black and 80 percent of a dimethylvinylsiloxy-terminated polydimethylsiloxane having a viscosity of about 0.4 Pa.s at 25° C.; and 0.2 parts of a reaction product of hexachloroplatinic acid and sym-tetramethyldivinyldisiloxane that has been diluted with a liquid dimethylvinylsiloxy terminated polydimethylsiloxane in an amount sufficient to achieve a platinum content of 0.7 weight percent.

The curing agent portion of the composition contained the following ingredients:

47 parts of a dimethylvinylsiloxy-terminated polydimethylsiloxane having a viscosity of about 0.4 Pa.s at 25° C.;

47 parts of finely divided quartz exhibiting an average particle size of 5 micrometers;

6 parts of a trimethylsiloxy-terminated polydiorganosiloxane containing an average of five methylhydrogensiloxane units and three dimethylsiloxane units per molecule with a silicon-bonded hydrogen atom content in the range from about 0.7 to 0.8 weight percent; and 0.1 part of cyclic methylvinylsiloxanes.

Portions of the resultant curable composition were blended with the types and amounts of additives listed in Table 4. The magnesium hydroxide [$Mg(OH)_2$], and aluminum acetonylacetonate [AlAcAc], were added as a 50 weight percent dispersion of the additive in a dimethylvinylsiloxy-terminated polydimethylsiloxane having a viscosity of about 0.4 Pa.s at 25° C.

The compositions were molded into cured sheets measuring 0.125 inch (3.2 mm) in thickness using a hydraulic press with a platen temperature of between 150° and 175° C. the samples were cured for 10–15 minutes under a pressure of 2000 p.s.i. (13.8 MPa)

Test samples measuring 5 inches×½ inch (127×12.7 mm.) were cut from the sheet and evaluated for flammability using test procedure UL 94 developed by Underwriters Laboratory. In accordance with this test procedure the samples were suspended from a clamp such that the lower end of the sample was ⅜ inch (9.5 mm) above the top of the tube of a Bunsen burner supplied with methane gas. The air inlet of the burner is adjusted to produce a ¾ inch (19 mm)—high blue flame.

The lower end of the test sample is placed in the central portion of the flame for 10 seconds, at which time the flame is withdrawn a distance of at least 6 inches (15.2 cm.) from the flame and the duration of flaming of the specimen is recorded as burn time 1. When the flame extinguishes the lower end of the sample is reinserted in the flame for an additional 10 seconds, withdrawn, and the burn time is again recorded as burn time 2 together with the length of time that the sample continues to glows (glow time) after the flame self extinguishes. Two samples of each composition were evaluated.

The comparative samples (2 and 4–9) lacked at least one of the three adhesion-promoting additives. Sample 1 contained no flame retarding or adhesion promoting additives, and was used as a control

TABLE 4

| Sample | Mg (OH)$_2$ (parts) | Epoxide Compound (parts) | Ethyl Polysilicate (parts) | AlAcAc (parts) |
|---|---|---|---|---|
| 1 (control) | 0 | 0 | 0 | 0 |
| 2 | 5 | 0 | 0 | 0 |
| 3 (invention) | 5 | 1.0 | 0.5 | 0.1 |
| 4 | 5 | 1.0 | 0.5 | 0 |
| 5 | 5 | 1.0 | 0 | 0.1 |
| 6 | 5 | 0 | 0.5 | 0.1 |
| 7 | 5 | 1.0 | 0 | 0 |
| 8 | 5 | 0 | 0.5 | 0 |
| 9 | 5 | 0 | 0 | 0.1 |

TABLE 5

| Composition | Burn Time 1* (sec) | Burn Time 2 (sec) | Glow Time (sec) |
|---|---|---|---|
| 1 (control) | 0, 0 | 5, 10 | 0, 15 |
| 2 | 0, 2 | 5, 10 | 0, 0 |
| 3 (invention) | 0, 0 | 5, 15 | 0, 20 |
| 4 | 3, 2 | 15, 17 | 17, 0 |
| 5 | 2, 2 | 20, 30 | 25, 32 |
| 6 | 2, 2 | 5, 10 | 0, 0 |
| 7 | 2, 4 | 20, 15 | 25, 20 |
| 8 | 0, 0 | 0, 3 | 5, 7 |
| 9 | 0, 2 | 20, 45 | 0, 65 |

* = Burn times for two samples

The effect on flammability of heating the cured samples at 100° C. for two hours was determined and the results are reported in Table 6.

TABLE 6

| Composition | Burn Time 1* (sec) | Burn Time 2 (sec) | Glow Time (sec) |
|---|---|---|---|
| 1 (Control) | 0, 3 | 15, 15 | 20, 0 |
| 2 | 0, 0 | 15, 20 | 0, 0 |
| 3 (Invention) | 0, 0 | 17, 35 | 0, 40 |
| 4 | 3, 2 | 10, 10 | 15, 20 |
| 5 | 2, 2 | 40, 25 | 45, 30 |
| 6 | 4, 0 | 12, 20 | 0, 0 |
| 7 | 0, 5 | 12, 18 | 15, 20 |
| 8 | 0, 0 | 7, 6 | 0, 0 |
| 9 | 3, 0 | 30, 30 | 0, 0 |

EXAMPLE 4

This example demonstrates the increase or decrease in flammability imparted by the various adhesion-promoting ingredients of the present invention in the absence of a flame-retarding agent.

The curable composition used to evaluate the ingredients contained the following ingredients.

60.1 parts of a dimethylvinylsiloxy-terminated polydimethylsiloxane having a viscosity of about 0.4 Pa.s at 25° C.;

32.5 parts of finely divided quartz with an average particle size of 5 micrometers;

2.63 parts of a dispersion containing 13 percent of zinc oxide. 7 percent carbon black and 80 percent of a dimethylvinylsiloxy-terminated polydimethylsiloxane having a viscosity of about 0.4 Pa.s at 25° C.;

4.44 parts of a trimethylsiloxy-terminated polydiorganosiloxane having an average of five methylhydrogensiloxane units and three dimethylsiloxane units per molecule with a silicon-bonded hydrogen atom content in the range from about 0.7 to 0.8 weight percent;

0.17 part of a reaction product of hexachloroplatinic acid and sym-tetramethyldivinyldisiloxane that has been diluted with a liquid dimethylvinylsiloxy terminated polydimethylsiloxane in an amount sufficient to achieve a platinum content of 0.7 weight percent; and 0.16 part of cyclic methylvinylsiloxanes.

Portions of this composition were blended with one of each of the following additives:

0.25 and 1.0 parts of the epoxide compound described in Example 1 (samples 10 and 11);

0.5 and 2 parts of ethylpolysilicate (samples 12 and 13. respectively); and 0.05 and 0.1 part of aluminum acetonylacetonate (samples 14 and 15, respectively).

The curable composition containing no adhesion promoting additives was evaluated as a control (sample 16)

Test samples were prepared from each of these compositions and evaluated for flammability as described in Example 3, and the results are recorded in Table 7.

TABLE 7

| Sample | Burn Time 1 (sec.) | Burn Time 2 + Glow Time (sec.) |
|---|---|---|
| 10 | 5 | 35 |
| 11 | 8 | 18 |
| 12 | 4 | 12 |
| 13 | 4 | 13 |

TABLE 7-continued

| Sample | Burn Time 1 (sec.) | Burn Time 2 + Glow Time (sec.) |
|---|---|---|
| 14 | 18 | 28 |
| 15 | >60 | >60 |
| 16 (control) | 7 | 40 |

The reported burn times are an average of 5 samples

EXAMPLE 5

This example demonstrates the effect of total filler content on the flame retardancy imparted by the flame retarding agents used in combination with the present adhesion promoting additives. The curable compositions were prepared by combining the ingredients listed in Table 8 to homogeneity. All of the compositions contained 6 parts of 3,4-epoxycyclohexylmethyl-3,4-epoxycyclohexylcarboxylate, 3 parts of ethyl polysilicate and 0.6 parts of a dispersion containing 50 weight percent of aluminum acetonylacetonate and 50 weight percent of a dimethylvinylsiloxy-terminated polydimethylsiloxane having a viscosity of about 0.4 Pa.s at 25° C.

One of the two flame retarding agents (FR1) was magnesium hydroxide that was added as a dispersion in a portion of ingredient A that also contained portions of ingredients C and F.

The second flame retarding agent (FR2) was a dispersion containing 50 weight percent of hydrated aluminum oxide and 50 weight percent of a dimethylvinylsiloxy-terminated polydimethylsiloxane having a viscosity of about 0.4 Pa.s at 25° C.

Samples were prepared and tested for flame retardancy as described in Example 3. The burn time following the first exposure to the flame is referred to as F1, the burn time following the second exposure to the flame is referred to as F2 and the time during which the sample glowed following the second exposure is referred to as GT. The glow time was not determined if the sample burned for more than 60 second following the second exposure to the flame.

TABLE 8

| Sample | INGREDIENT (Parts) | | | | | | | | Time in Seconds | | |
|---|---|---|---|---|---|---|---|---|---|---|---|
| | A | B | C | D | E | F | FR1 (%) | FR2 (%) | F1 | F2 | GT |
| 17* | 279 | 18 | 0.6 | 0.3 | 279 | 21 | 0 | 0 | 0 | 60+ | — |
| 18 | 393 | 27 | 0.6 | 0.5 | 132 | 30 | 6.9 (1.1) | 0 | 10 | 60+ | — |
| 19 | 401 | 27 | 1.2 | 0.5 | 133 | 30 | 0 | 6.9 (1.1) | 5 | 60+ | — |
| 20 | 401 | 27 | 0.9 | 0.5 | 122 | 30 | 17.3 (2.8) | 0 | 0 | 60+ | — |
| 21 | 401 | 27 | 0.7 | 0.5 | 122 | 30 | 0 | 17.3 (2.8) | 4 | 60+ | — |
| 22 | 341 | 23 | 0.4 | 0.4 | 200 | 26 | 0 | 10.4 (1.7) | 3 | 60+ | — |
| 23 | 341 | 23 | 0.4 | 0.4 | 200 | 26 | 10.4 (1.7) | 0 | 0 | 60+ | — |
| 24 | 341 | 23 | 0.4 | 0.4 | 184 | 26 | 0 | 26.1 (4.3) | 0 | 60+ | — |
| 25 | 275 | 23 | 0.5 | 0.4 | 184 | 26 | 29 (4.3) | 0 | 0 | 30 | 45 |
| | | | | | | | | | 0 | 60+ | — |
| 26* | 401 | 27 | 1.1 | 0.5 | 140 | 30 | 0 | 0 | — | 0 | — |
| 27* | 340 | 26 | 0.8 | 0.4 | 209 | 26 | 0 | 0 | 5 | 60+ | — |
| 28 | 379 | 18 | 0.5 | 0.3 | 265 | 21 | 0 | 13.8 (2.3) | 0 | 5 | 10 |
| | | | | | | | | | 0 | 40 | 50 |
| 29 | 279 | 18 | 0.6 | 0.3 | 265 | 21 | 13.8 (2.3) | 0 | 0 | 3 | 5 |
| | | | | | | | | | 0 | 15 | 30 |
| 30 | 279 | 18 | 0.5 | 0.3 | 245 | 21 | 0 | 34.7 (5.7) | 0 | 0 | 5 |
| | | | | | | | | | 0 | 5 | 10 |
| 31 | 280 | 18 | 0.5 | 0.3 | 245 | 21 | 34.5 (5.7) | 0 | 0 | 0 | 0 |

* = Comparative Example

Ingredient A was a dimethylvinylsiloxy-terminated polydimethylsiloxane having a viscosity of about 0.4 Pa.s at 25° C.

Ingredient B was a trimethylsiloxy-terminated polydiorganosiloxane having an average of five methylhydrogensiloxane units and three dimethylsiloxane units per molecule with a silicon-bonded hydrogen atom content in the range from about 0.7 to 0.8 weight percent.

Ingredient C was a reaction product of hexachloroplatinic acid and sym-tetramethyldivinyldisiloxane that had been diluted with a liquid dimethylvinylsiloxy terminated polydimethylsiloxane in an amount sufficient to achieve a platinum content of 0.7 weight percent.

Ingredient D was cyclic methylvinylsiloxanes; and functioned as a catalyst inhibitor; ingredient E was finely divided quartz exhibiting an average particle size of 5 microns.

Ingredient F was a dispersion containing 13 percent of zinc oxide, 7 percent carbon black and 80 percent of a dimethylvinylsiloxy-terminated polydimethylsiloxane having a viscosity of about 0.4 Pa.s at 25° C.

That which is claimed is:
1. A curable organosiloxane composition comprising
   (A) a polyorganosiloxane containing at least two alkenyl radicals per molecule,
   (B) an amount sufficient to cure said composition of an organohydrogensiloxane containing at least two silicon-bonded hydrogen atoms per molecule, where the sum of the alkenyl radicals per molecule of (A) and the silicon-bonded hydrogen atoms per molecule of (B) is greater than 4,
   (C) an amount sufficient to promote curing of said composition of a hydrosilation catalyst selected from the group consisting of metals from the platinum group of the periodic table and compounds of said metals, and
   (D) an adhesion promoting additive comprising
      1) a liquid organic epoxide compound;
      2) an organosilicon compound selected from the group consisting of silanes exhibiting the general formula $R^1_a SiX_{4-a}$, and hydrolysis and condensation products of said silanes, where $R^1$ represents an alkyl radical, X represents a hydrolyzable group and a is 0 or 1; and 3) a chelated organoaluminum compound;
wherein the adhesion promoting additive is added in an amount sufficient to impart adhesion to substrates in contact with the composition during curing; and
(E) an amount sufficient to decrease the flammability imparted to said composition by the organoaluminum compound of a filler comprising at least one flame retarding agent selected from the group consisting of hydrated aluminum oxide and magnesium hydroxide.

2. A composition according to claim 1 where said epoxide compound constitutes from 0.1 to 5 weight percent of said composition; $R^1$ represents an alkyl group containing from 1 to 4 carbon atoms, X is selected from the group consisting of alkoxy groups containing from 1 to about 4 carbon atoms, enoloxy groups containing from 3 to about 6 carbon atoms, and ketoximo groups containing from 2 to about 6 carbon atoms; and the composition further comprises a filler other than component E in an amount sufficient to constitute at least 90 percent of the combined weight of fillers present in the composition.

3. A composition according to claim 2 where said chelated organoaluminum compound is aluminum acetonylacetonate and constitutes from 0.05 to 0.1 weight percent of said composition, said epoxide compound constitutes from 0.5 to 2 weight percent, based on the weight of said composition and is selected from the group consisting of glycidyl ethers of phenols, bis-phenols and mono- and polyhydric alcohols, styrene oxide, limolene oxide, cyclohexene oxide, bis(2,3-epoxypropoxyl)cyclohexane and 3,4-epoxycyclohexylmethyl-3,4-epoxycyclohexylcarboxylate, said organosilicon compound constitutes from 0.25 to 2 weight percent of said composition, said filler constitutes at least 90% of the combined weight of said filler and said additive and is selected from the group consisting of fume silica, precipitated silica and quartz, and X represents an alkoxy group.

4. A composition according to claim 3 where said additional filler is quartz and constitutes from 35 to 50 weight percent of said composition, and said organosilicon compound is selected from tetraethyl orthosilicate or ethyl polysilicate.

5. A composition according to claim 1 where said curable polyorgnosiloxane is a polydiorganosiloxane corresponding to the formula

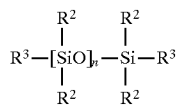

where each $R^2$ is individually selected from monovalent hydrocarbon radicals and monovalent halohydrocarbon radicals, $R^3$ represents an alkenyl, radical, and n represents a degree of polymerization equivalent to a viscosity of at least 0.1 Pa.s; and said hydrosilation catalyst is a platinum compound and is present at a concentration equivalent to from 0.1 to 500 parts by weight of platinum per million parts, based on the combined weight of said polyorganosiloxane and said organohydrogensiloxane.

6. A composition according to claim 5 wherein $R^2$ is methyl, $R^3$ is vinyl or 5-hexenyl, the viscosity of said polydiorganosiloxane is from 0.1 to 10 Pa.s, the viscosity of said organohydrogensiloxane is from 0.003 to 10 Pa.s and the molar ratio of silicon-bonded hydrogen atoms in said organohydrogensiloxane to $R^3$ radicals in said polydiorganosiloxane is from 0.5 to 20.

7. A composition according to claim 1 where said composition is packaged in at least two containers with said organohydrogensiloxane and said hydrosilation catalyst located in separate containers.

8. A method for bonding two substrates, the method comprising the sequential steps of
1) applying to a surface of one of said substrates a curable organosiloxane composition comprising
(A) a polyorganosiloxane containing at least two alkenyl radicals per molecule,
(B) an amount sufficient to cure said composition of an organohydrogensiloxane containing at least two silicon-bonded hydrogen atoms per molecule, where the sum of the alkenyl radicals per molecule of (A) and the silicon-bonded hydrogen atoms per molecule of (B) is greater than 4,
(C) an amount sufficient to promote curing of said composition of a hydrosilation catalyst selected from the group consisting of metals from the platinum group of the periodic table and compounds of said metals, and
(D) an amount sufficient to impart adhesion to substrates in contact with the composition during curing of an adhesion promoting additive comprising
1) a liquid organic epoxide compound;
2) an organosilicon compound selected from the group consisting of silanes exhibiting the general formula $R^1_a SiX_{4-a}$, and hydrolysis and condensation products of said silanes, where $R^1$ represents an alkyl radical, X represents a hydrolyzable group and a is 0 or 1; and
3) a chelated organoaluminum compound; and
(E) an amount sufficient to decrease the flammability imparted to said composition by the organoaluminum compound of a filler comprising at least one flame retarding agent selected from the group consisting of hydrated aluminum oxide and magnesium hydroxide;
2) placing the surface coated with said composition in contact with a surface of a second substrate and curing said organosiloxane composition.

9. A method according to claim 8 wherein, $R^1$ represents an alkyl group containing from 1 to 4 carbon atoms, X is selected from the group consisting of alkoxy groups containing from 1 to 4 carbon atoms, enoloxy groups containing from 3 to about 6 carbon atoms and ketoximo groups containing from 2 to about 6 carbon atoms; said epoxide compound constitutes from 0.1 to 5 weight percent of said composition and is selected from the group consisting of glycidyl ethers of phenols, bis-phenols and mono- and polyhydric alcohols, styrene oxide, limolene oxide, bis(2,3 epoxypropoxy) cyclohexane and 3,4-epoxycyclohexylmethyl-3,4-epoxycyclohexylcarboxylate; said chelated organoaluminum compound being aluminum acetylacetonate and constituting 0.05 to 0.1 weight percent of said composition; said polyorganosiloxane is a polydiorganosiloxane corresponding to the formula

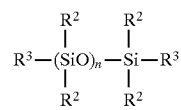

where $R^2$ is individually selected from monovalent hydrocarbon radicals, $R^3$ represents an alkenyl radical, n represents a degree of polymerization equivalent to a viscosity of at least 0.1 Pa.s and said hydrosilation catalyst is a platinum compound and is present at a concentration equivalent to from 0.1 to 500 parts by weight of platinum per million parts, based on the combined weight of said polyorganosiloxane and said organohydrogensiloxane.

10. A method according to claim 8 where said epoxide compound constitutes from 0.5 to 2 weight percent of said composition and is selected from the group consisting of glycidyl ethers of phenols, bis-phenols and mono- and polyhydric alcohols, styrene oxide, limolene oxide, cyclohexene oxide, bis(2,3-epoxypropoxyl) cyclohexane and 3,4-epoxycyclohexylmethyl-3,4-epoxycyclohexylcarboxylate, said organosilicon compound constitutes from 0.25 to 2 weight percent of said composition, and said additive constitutes no more than 10 weight percent of the total filler present in said composition.

11. The composition of claim 1 wherein the flame retardant of component (E) is hydrated aluminum oxide, and the flame retardant is present at 1 to about 10 weight percent of component (E).

12. The composition of claim 11 wherein the flame retardant is present at 2 to about 6 weight percent of component (E).

13. The composition of claim 1 further comprising an acetylenic alcohol platinum catalyst inhibitor.

14. A composition according to claim 1 wherein component (C) is microencapsulated in a polymer selected from the group consisting of thermoplastic and thermosetting polymers, and the composition is a one-part composition.

15. The composition of claim 1 wherein the flame retarding agent of component (E) is magnesium hydroxide, and the flame retarding agent is present at 1 to about 10 weight percent of component(E).

* * * * *